(12) United States Patent
Lee et al.

(10) Patent No.: US 8,944,643 B2
(45) Date of Patent: Feb. 3, 2015

(54) LIGHT EMITTING DIODE PACKAGE, METHOD FOR MANUFACTURING THE SAME AND LIGHT SOURCE UNIT HAVING THE LED PACKAGE

(75) Inventors: Sun-Hwa Lee, Paju-si (KR); Hyun-Ho Shin, Anyang-si (KR); Keon-Soo Nah, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 304 days.

(21) Appl. No.: 12/591,841

(22) Filed: Dec. 2, 2009

(65) Prior Publication Data

US 2010/0208468 A1    Aug. 19, 2010

(30) Foreign Application Priority Data

Feb. 17, 2009    (KR) .................. 10-2009-0012965

(51) Int. Cl.

| F21V 5/04 | (2006.01) |
|---|---|
| H01L 33/58 | (2010.01) |
| G02B 5/02 | (2006.01) |
| G02B 19/00 | (2006.01) |
| F21K 99/00 | (2010.01) |
| G02F 1/1335 | (2006.01) |
| F21Y 101/02 | (2006.01) |

(52) U.S. Cl.
CPC *H01L 33/58* (2013.01); *G02B 5/02* (2013.01); *G02B 19/0066* (2013.01); *G02B 19/0028* (2013.01); *F21K 9/00* (2013.01); *G02F 1/133603* (2013.01); *H01L 2933/0091* (2013.01); *F21Y 2101/02* (2013.01)
USPC ............ 362/311.02; 362/311.06; 362/311.09; 362/311.14

(58) Field of Classification Search
USPC .................. 362/311.02, 555, 311.06, 311.09, 362/311.15, 311.14; 438/22, 26, 27, 28, 29, 438/106, 110, 116; 257/79, 99, 100, 678, 257/685, 730, 787
See application file for complete search history.

(56) References Cited

U.S. PATENT DOCUMENTS

| 3,887,803 A | * | 6/1975 | Savage, Jr. .................... 362/363 |
| 5,625,498 A | * | 4/1997 | Wu et al. ....................... 359/811 |
| 6,626,557 B1 | * | 9/2003 | Taylor .......................... 362/235 |
| 7,293,889 B2 | * | 11/2007 | Kamiya et al. .................. 362/84 |
| 7,407,312 B2 | * | 8/2008 | Lee ................................ 362/555 |
| 7,845,836 B2 | * | 12/2010 | Okuda .......................... 362/488 |
| 7,984,999 B2 | * | 7/2011 | Harbers et al. ................ 362/231 |
| 8,106,859 B2 | * | 1/2012 | Ohkawa et al. .................. 345/82 |
| 2007/0019416 A1 | * | 1/2007 | Han et al. ...................... 362/307 |

FOREIGN PATENT DOCUMENTS

| CN | 1680748 A | 10/2005 |
| CN | 1885128 A | 12/2006 |
| CN | 1992360 A | 7/2007 |
| CN | 101204862 A | 6/2008 |
| JP | 2001-242810 A | 9/2001 |
| KR | 10-2008-0056784 A | 6/2008 |
| KR | 10-2008-0062086 A | 7/2008 |

* cited by examiner

*Primary Examiner* — Sharon Payne
(74) *Attorney, Agent, or Firm* — McKenna Long & Aldridge LLP

(57) ABSTRACT

Disclosed are a high efficiency LED package with reduced production costs, a method for manufacturing the same, and a light source unit having the LED package. The method for manufacturing the LED package includes preparing a mold frame on which an LED is mounted, forming a hemi-spherical lens having a reverse-conical top part and a lateral part with haze formed by sanding or bead treatment, and fixing the lens to the mold frame to enclose the LED.

8 Claims, 4 Drawing Sheets

ND LIGHT SOURCE UNIT HAVING
LIGHT EMITTING DIODE PACKAGE, METHOD FOR MANUFACTURING THE SAME AND LIGHT SOURCE UNIT HAVING THE LED PACKAGE

This application claims the benefit of Korean Patent Application No. 10-2009-0012965 filed on Feb. 17, 2009, which is hereby incorporated by reference as if fully set forth herein.

BACKGROUND OF THE INVENTION

1. Field of the Invention

The present invention relates to a light emitting diode package, a method for manufacturing the same and a light source unit having the LED package and, more particularly, to a high efficiency LED package with reduced production costs, a method for manufacturing the same and a light source having the high efficiency LED package.

2. Discussion of the Related Art

With progress towards an advanced information society, there is a strong need for development of various display devices and, especially, a liquid crystal display (LCD), a plasma display panel (PDP), an electro luminescent display (ELD), a field emission display (FED), a vacuum fluorescent display (VFD), and the like are recently under active study and investigation. Among these, in consideration of high resolution, mass-production, convenient driving unit, low weight, thin design, low power consumption, etc., an LCD draws remarkable attention in the related art.

An LCD displays an image by applying an electric field to a liquid crystal material having dielectric anisotropy introduced between two substrates and controlling an intensity of the electric field so as to regulate an amount of light transmitted through the substrates. Since an LCD panel in the LCD is a non-emissive device, the LCD requires a light source unit to provide light to the LCD panel.

A lamp used for the light source unit may include, for example, a cold cathode fluorescent lamp ("CCFL"), an external electrode fluorescent lamp ("EEFL"), a light emitting diode ("LED"), etc. Compared to other devices such as CCFLs, an LED light source unit has various advantages such as longer lifespan, faster lighting speed, smaller size, higher luminance, excellent energy efficiency, and the like, and as such is expected to be a next generation light source.

The LED light source unit is fabricated by preparing a package of red (R), green (G) and blue (B) LED chips to form a cluster and forming at least one line comprised of the prepared LED packages. A plurality of lights emitted from R, G and B LED chips to form a cluster, are combined together to complete a white light which in turn exits out of the cluster.

Referring to FIG. 1, the exiting light may result in lattice spots centering around the middle of the cluster based on radiation properties thereof in relation to LED manufacture. In order to prevent such lattice spots, use of an optical sheet required is increased and increased use of the optical sheet may cause an increase in production costs thereof.

The LED consumes only 15% of the energy supplied thereto to emit light while the remaining 85% of the energy is emitted as heat. Therefore, increasing the number of LEDs may increase heat generated from the LEDs and, in addition, may increase power consumption for driving the LED light source unit. Moreover, there is a problem in that an edge part at one side is brighter than that at the other side.

SUMMARY OF THE INVENTION

Accordingly, the present invention is directed to solving the problems described above in regard to conventional techniques, and an object of the present invention is to provide a high efficiency LED package with reduced production costs, a method for manufacturing the same, and a light source unit having the fabricated LED package.

To achieve this object and other advantages and in accordance with the purpose of the invention, there is provided a method for manufacturing an LED package, including: preparing a mold frame on which an LED is mounted; forming a lens of hemi-sphere having a reverse-conical top part and a lateral part with haze formed by sanding or bead treatment; and fixing the lens to the mold frame in order to enclose the LEDs.

Here, the sanding process is carried out using a sandblasting apparatus to spray scattered particles to an outer side of the lens.

The bead treatment is performed to introduce scattered particles into the lens.

The bead treatment is performed by a double injection process including primary injection of a top part which does not contain the scattered particles, and secondary injection of a lateral part to which the scattered particles are added, over the first-injected top part.

The LED package of the present invention may include a mold frame mounted on a printed circuit board supplied power from an external power supply, an LED placed on the mold frame to emit light, and a lens of hemi-sphere fixed to the mold frame to enclose the LED, which has a reverse-conical top part and a lateral part with haze formed by a sanding process or bead treatment.

The haze may be formed by the sanding process to adhere scattered particles to an outer side of the lateral part of the lens.

Alternatively, the haze may be formed by bead treatment to introduce scattered particles into the lateral part of the lens.

The light source unit having the LED package of the present invention may include: the LED package including a mold frame mounted on a printed circuit board supplied power from an external power supply, an LED placed on the mold frame to emit light, and a lens of hemi-sphere that has a reverse-conical top part and a lateral part with haze formed by sanding or bead treatment; a light diffusion plate to diffuse light emitted from the LED package; and a plurality of optical sheets to improve a luminance of the light emitted from the LED package.

The plurality of optical sheet may be at least one selected from a diffusion sheet, a prism sheet, a polarizer sheet and a protection sheet.

As is apparent from the above disclosure, the present invention may have advantages of preventing LED light from being emitted only in a vertical direction while broadening orientation angles of the light to improve diffusion of light, thereby enhancing light efficiency such as a uniform luminance.

Moreover, the present invention may decrease the number of optical sheets and the number of LED packages required, so that power consumption and production costs are reduced while enabling manufacture of a thinner display device having a light source unit.

It is to be understood that both the foregoing general description and the following detailed description of the present invention are exemplary and explanatory and are intended to concretely describe the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, an LED package, a method for manufacturing the same and a light source unit having the fabricated LED package according to the present invention will be described in detail from the following description with reference to exemplary embodiments, taken in conjunction with the accompanying drawings.

Figure 1:
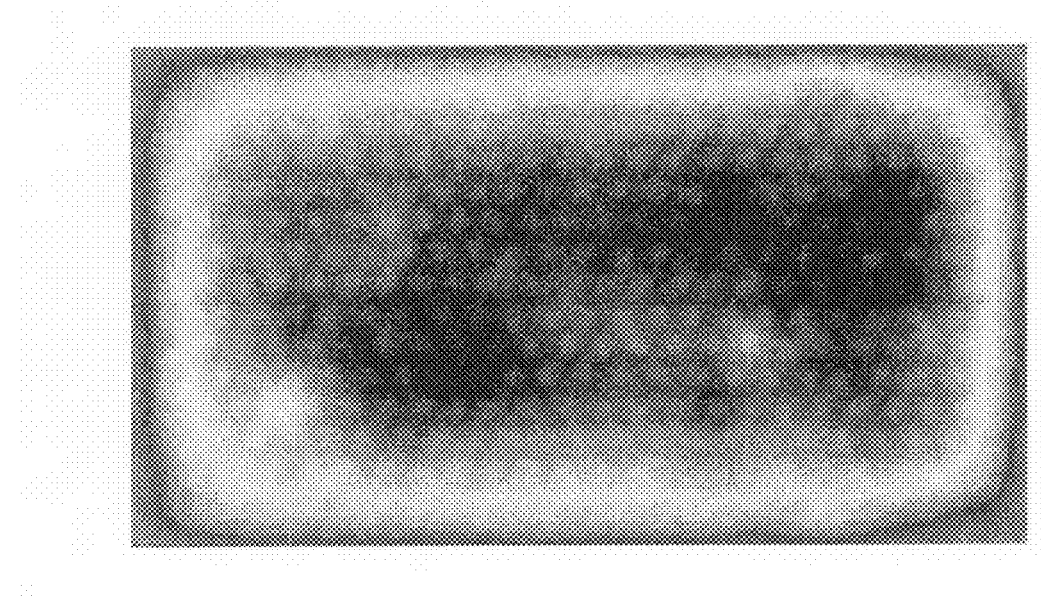
FIG. 1 is a photograph showing a light emission pattern of a light source unit using a conventional LED package.
Figure 2A:
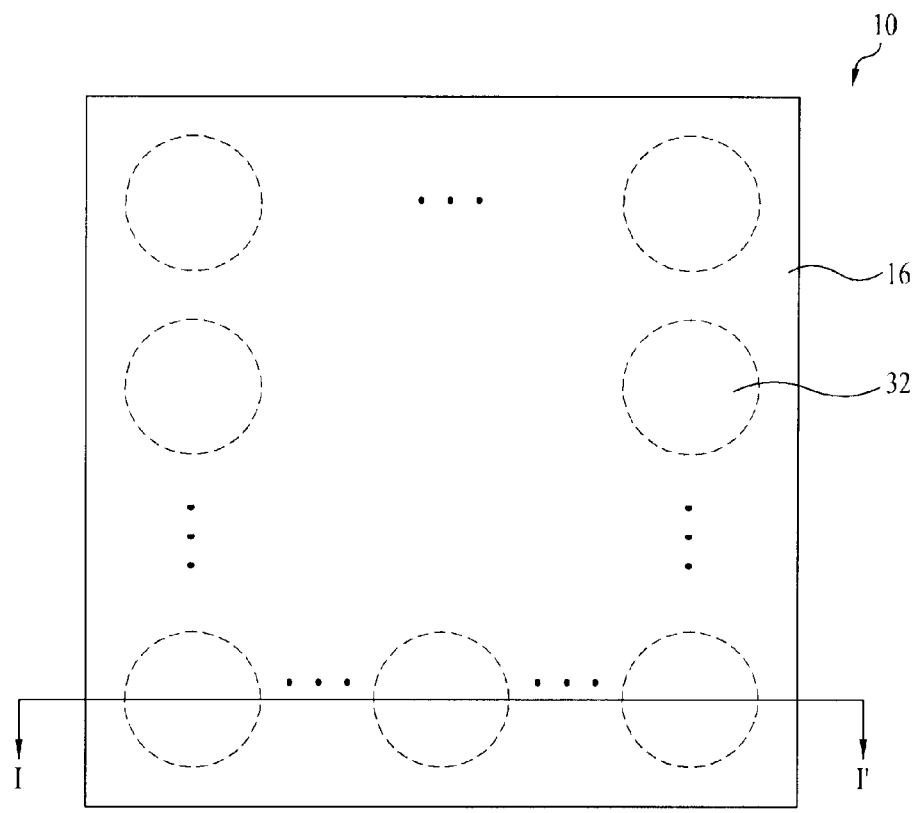
FIG. 2A and FIG. 2B are a plan view and a cross-sectional view schematically illustrating a light source unit according to the present invention, respectively.
Figure 2B:
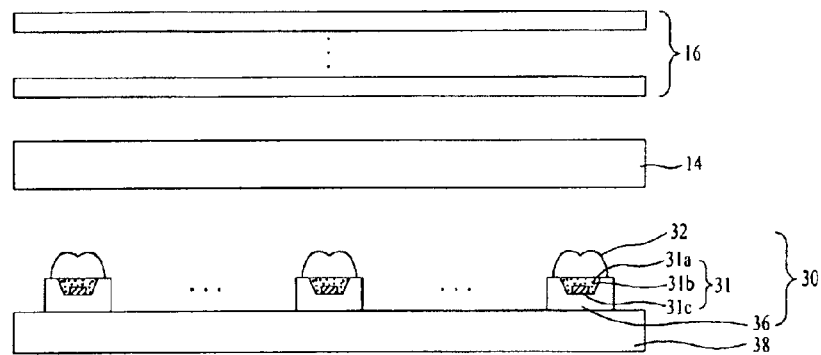

FIG. 2A is a plan view illustrating a light source unit 10 having an LED package of the present invention and FIG. 2B is a cross-sectional view illustrating the foregoing light source unit 10, taken along the line (I-I') in FIG. 2A. The above light source unit 10 comprises a plurality of LED packages 30 to emit light and a plurality of optical sheets 16 aligned apart from the LED packages 30 at constant intervals. The light source unit 10 may further include a printed circuit board (PCB) 38 on which the LED packages 30 are mounted, and a diffusion plate 14 to diffuse the light and a reflection plate (not shown) to reflect the light emitted from the LED packages 30.

The plurality of LED packages 30 are aligned and spaced from one another at constant intervals. One LED package 30 comprises a mold frame 36 placed on the PCB 38, an LED 31 fixed to the mold frame 36, and a lens 32 enclosing the LED 31.

The mold frame 36 may transfer heat generated from the LED 31 to the PCB 38. The PCB 38 may be made of a metal substrate such as aluminum in order to discharge the heat generated from the LED 31 and, in addition, to provide power from an external power supply to the LED 31 via a soldering leg (not shown).

The LED 31 creates minority carriers such as electrons and/or electron holes by injection through a p-n junction structure of a semiconductor and generates light by re-combination of the minority carriers. The LED 31 is fixed inside of the mold frame 36 and comprises red (R) phosphor 31a, green (G) phosphor 31b and a blue (B) LED chip 31c to create white light.

Referring to FIGS. 3A to 4B, a lens 32 diffuses the light emitted from the LED 31 to broaden a light radiation width and transmits the diffused light to the outside. The lens 32 may be formed in a hemi-sphere shape comprising a first part 32a with a reverse-conical convex lens type groove at a top of the lens 32 and a second part 32b as a lateral part of the lens substantially occupying the other portion except for the first part 32a of the lens 32, wherein haze may be formed on an outer surface of the second part 32b or inside the second part 32b, that is, may be integrated with the lens 32. The haze may be formed by sanding or bead treatment.

Figure 3A:
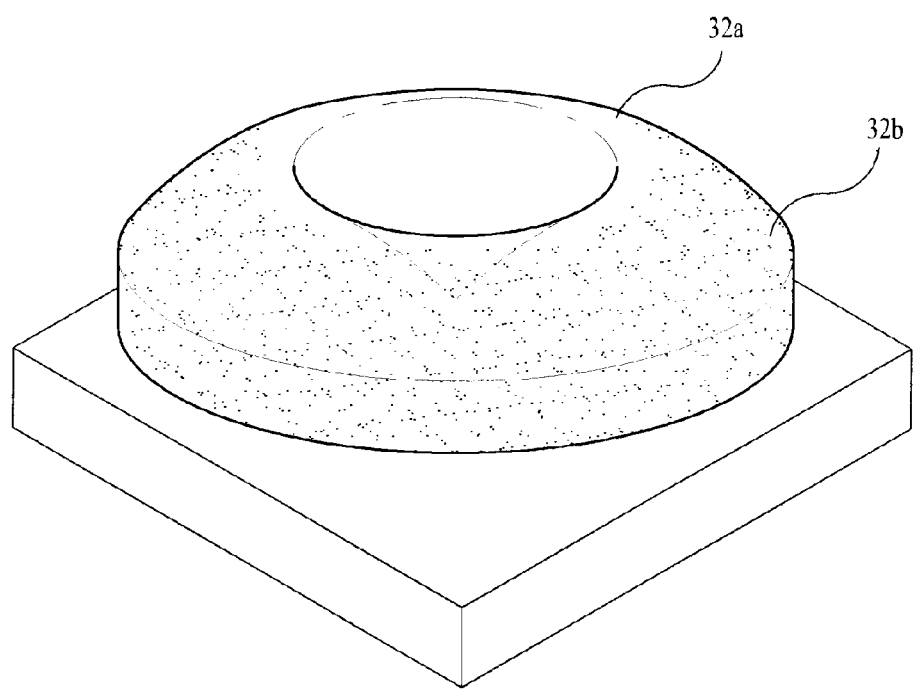
FIG. 3A and FIG. 3B are a perspective view and a cross-sectional view illustrating a lens in an LED package according to an exemplary embodiment of the present invention, respectively.
Figure 3B:
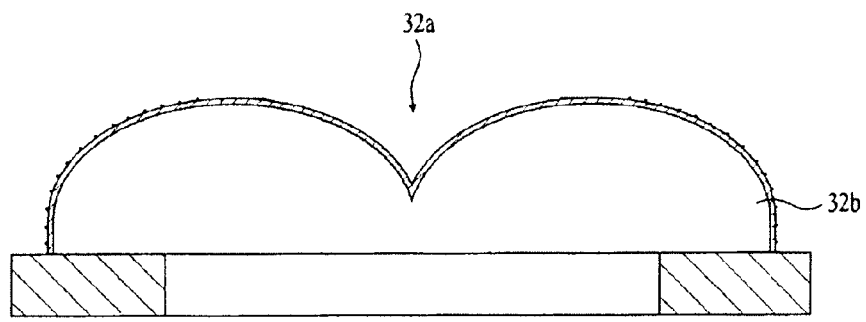

More particularly, the sanding process may produce the haze on the outer surface of the second part 32b of the lens 32 only, so that a light emission site is not limited to the first part 32a at the center of the lens 32, as illustrated in FIGS. 3A and 3B. The sanding process is performed using a sand-blasting apparatus to spray scattered particles with a desire particle size depending on roughness over the surface of the lens 32. The sanding process may be locally performed on the second part 32b.

Figure 4A:
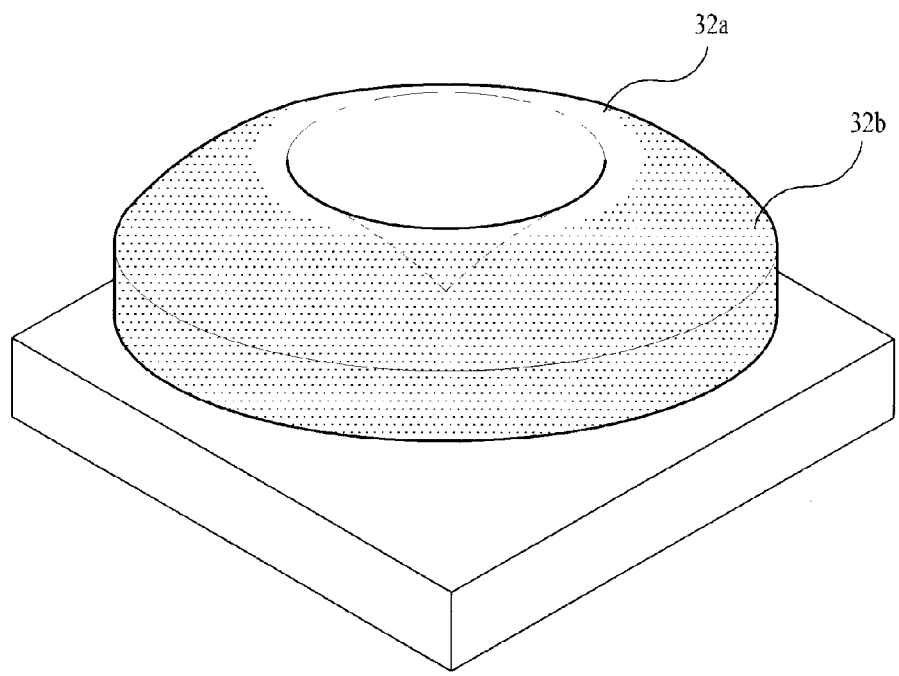
FIG. 4A and FIG. 4B are a perspective view and a cross-sectional view illustrating a lens in an LED package according to another exemplary embodiment of the present invention, respectively.
Figure 4B:
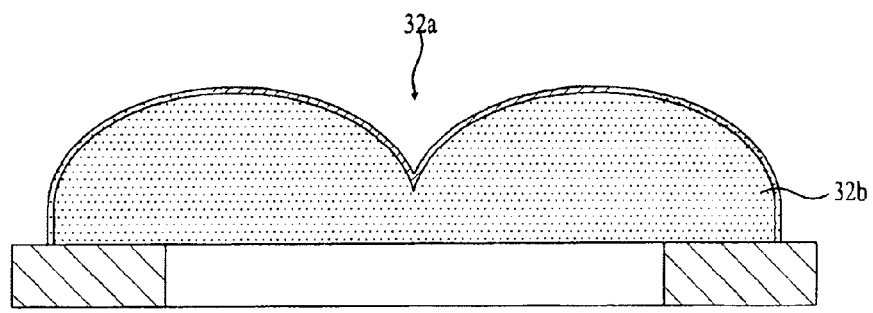

The bead treatment may introduce scattered particles into the lens 32, that is, may be performed by combining scattered particles with a material for fabrication of the lens 32 and injecting the mixture to form the second part 32b, as illustrated in FIGS. 4A and 4B. Here, the bead treatment is performed by a double injection process comprising primary injection of the first part 32a without haze and secondary injection of the second part 32b over the first part 32 so as to form haze integrated with the lens 32, wherein the second part 32b may have the haze formed thereon.

As such, the local sanding or bead treatment of the second part 32b as the lateral part of the lens 32 to form haze may prevent light from being emitted only in a vertical direction while improving light diffusion efficiency, wherein the light is generated from R, G and B LEDs 31. As a result, the light may have a uniform luminance such as reduced generation of lattice spots which in turn enhances light efficiency, and may diffuse LED light in all directions so as to decrease the number of optical sheets and LED packages. Decreasing the number of LED packages, power consumption and production costs may be reduced and a display device using a light source unit may be thinner than conventional products.

The number of the LED packages 30 may be changed depending on a size of a display panel using the LED package 30 as a light source.

Again referring to FIGS. 2A and 2B, the optical sheets 16 may serve to improve a luminance of light exiting from the LED packages 30, as well as luminance uniformity thereof. Such an optical sheet may comprise at least one selected from a diffusion sheet, a prism sheet, a polarizer sheet and a protection sheet.

The diffusion sheet may function to diffuse the light exiting from the LED package 30. More particularly, the diffusion sheet directs an incident light received from a diffusion plate 14 to a front side of a display panel and diffuses the light to have a uniform distribution thereof in a wide range, thereby radiating the light on the display panel. The prism sheet may collect the light diffused through the diffusion sheet in a direction perpendicular to the display panel. The polarizer sheet may transmit light parallel to a transmission axis of the polarizer sheet while reflecting light perpendicular to the transmission axis. The protection sheet may protect the polarizer sheet or the prism sheet against damage.

When the haze is formed on the lateral part of the lens 32 according to the present invention, the number of optical sheets 16 may be decreased which in turn reduces production costs and enables manufacture of a thinner display device having a light source unit 10 with LED packages 30.

The diffusion plate 14 is spaced from the LED package 30 at a certain interval and placed between the LED package 30 and the optical sheets 16, so as to diffuse the light emitted from the LED package 30 throughout a surface of the display panel.

The reflection plate (not shown) is a plate with a high light reflectance, which again reflects the light incident upon the reflection plate via a rear side of the diffusion plate 14 toward the same diffusion plate 14, thus reducing light loss. The reflection plate may be placed below the LED package 30 or between plural LED packages 30.

The following description will be given of a method for manufacturing the LED package 30 of the present invention. Except for formation of the lens 32, any conventional process for fabrication of LED packages will be omitted hereinafter.

According to the present invention, a lens 32 of hemisphere having a reverse-conical top part 32a and a lateral part 32b with haze formed by sanding or bead treatment is formed.

More particularly, the sanding process is performed using a sand-blasting apparatus in order to spray scattered particles over an outer side of the lateral part 32b of the lens 32. The bead treatment is performed by a double injection process comprising primarily injecting the top part 32a which does not contain scattered particles, and then, injecting the lateral part 32b to which scattered particles are added, over the first injected top part. As a result, the lens 32 may contain the scattered particles therein to form haze.

As described above, when the haze is formed on the lateral part 32b of the lens 32, emission of the light generated from the LED 31 in a vertical direction only may be inhibited while improving light diffusion efficiency of the lens. As a result, the lens may exhibit a uniform luminance such as inhibited generation of lattice spots which in turn enhances light efficiency of the lens, thereby reducing the number of LED packages required. In addition, decreasing the number of LED packages may reduce power consumption and production costs and/or may enable manufacture of a thinner display device using a light source unit with LED packages.

Following this, the lens 32 with haze is fixed to the mold frame 36 on which an LED 31 is mounted, so as to enclose the LED 31 and complete the LED package 30.

Although technical constructions and other features of the present invention have been described, it will be apparent to those skilled in the art that the present invention is not limited to the exemplary embodiments and accompanying drawings described above but may cover substitutions, variations and/or modifications thereof without departing from the scope of the invention defined in the appended claims.

What is claimed is:

1. A method for manufacturing an LED package, comprising:
   preparing a mold frame on which an LED is mounted;
   forming a unitary hemi-spherical lens including a reverse-conical top central part injected between adjacent two half-circles and a lateral part being another portion except for a top part of the lens; and
   fixing the lens to the mold frame to enclose the LED,
   wherein a width of the lens is less than a width of the mold frame such that the entire lens is positioned on the mold frame,
   wherein haze is formed on only the entire lateral part by sanding to adhere scattered particles to an outer side of the lateral part of the lens or bead treatment, in order to prevent light of the LED from being emitted only in a vertical direction to enhance light diffusion efficiency, and
   wherein the LED is fixed inside of the mold frame and comprised of red phosphor, green phosphor, and a blue LED chip.

2. The method according to claim 1, wherein the sanding treatment is performed using a sand-blasting apparatus to spray and adhere the scattered particles on the outer side of the lens.

3. The method according to claim 1, wherein the bead treatment is performed to introduce scattered particles into the lens.

4. The method according to claim 3, wherein the bead treatment is performed by a double injection process comprising injecting the top part which does not contain the scattered particles, and then, injecting the lateral part to which the scattered particles are added, over the first-injected top part.

5. An LED package comprising:
   a mold frame mounted on a printed circuit board supplied power from an external power supply;
   an LED placed on the mold frame to emit light; and
   a unitary hemi-spherical lens fixed to the mold frame to enclose the LED, wherein the lens includes a reverse-conical top central part injected between adjacent two half-circles and a lateral part being another portion except for a top part of the lens; and
   wherein a width of the lens is less than a width of the mold frame such that the entire lens is positioned on the mold frame,
   wherein haze is formed on only the entire lateral part by sanding to adhere scattered particles to an outside of the lateral part of the lens or bead treatment, in order to prevent light of the LED from being emitted only in a vertical direction to enhance light diffusion efficiency, and
   wherein the LED is fixed inside of the mold frame and comprised of red phosphor, green phosphor, and a blue LED chip.

6. The LED package according to claim 5, wherein the haze is formed by the bead treatment to introduce scattered particles into the lateral part of the lens.

7. A light source unit having an LED package, comprising:
   the LED package including a mold frame mounted on a printed circuit board supplied power from an external power supply, an LED placed on the mold frame to emit light, and a unitary hemi-spherical lens fixed to the mold frame to enclose the LED, wherein the lens includes a reverse-conical top central part injected between adjacent two half-circles and a lateral part being another portion except for a top part of the lens;
   a diffusion plate to diffuse the light exiting from the LED package; and
   a plurality of optical sheets to improve a luminance of the light exiting from the LED package, and
   wherein a width of the lens is less than a width of the mold frame such that the entire lens is positioned on the mold frame,
   wherein haze is formed on only the entire lateral part by sanding to adhere scattered particles to an outer side of the lateral part of the lens or bead treatment, in order to prevent light of the LED from being emitted only in a vertical direction to enhance light diffusion efficiency, and
   wherein the LED is fixed inside of the mold frame and comprised of red phosphor, green phosphor, and a blue LED chip.

8. The light source unit according to claim 7, wherein the plurality of optical sheets is at least one selected from a diffusion sheet, a prism sheet, a polarizer sheet, and a protection sheet.

* * * * *